United States Patent
Lee et al.

(10) Patent No.: US 11,776,873 B2
(45) Date of Patent: Oct. 3, 2023

(54) SEMICONDUCTOR STRUCTURE AND MANUFACTURING METHOD FOR THE SAME

(71) Applicant: MACRONIX INTERNATIONAL CO., LTD., Hsinchu (TW)

(72) Inventors: Dai-Ying Lee, Hsinchu County (TW); Ming-Hsiu Lee, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 91 days.

(21) Appl. No.: 17/688,961

(22) Filed: Mar. 8, 2022

(65) Prior Publication Data

US 2022/0199490 A1 Jun. 23, 2022

Related U.S. Application Data

(62) Division of application No. 16/826,330, filed on Mar. 23, 2020, now Pat. No. 11,302,605.

(51) Int. Cl.
*H01L 21/48* (2006.01)
*H01L 21/768* (2006.01)
*H01L 23/40* (2006.01)

(52) U.S. Cl.
CPC ............ *H01L 23/40* (2013.01); *H01L 21/486* (2013.01); *H01L 21/76897* (2013.01)

(58) Field of Classification Search
CPC . H01L 23/40; H01L 21/486; H01L 21/76897; H01L 21/76831; H01L 23/5226; H01L 23/5384; H01L 23/5386; H01L 23/5228; H01L 23/647; H10N 70/011; H10N 70/801
See application file for complete search history.

(56) References Cited

U.S. PATENT DOCUMENTS

| 7,933,139 B2 | 4/2011 | Lung |
| 2009/0122588 A1 | 5/2009 | Chen |
| 2011/0254112 A1 | 10/2011 | Yamanaka et al. |
| 2014/0264934 A1 | 9/2014 | Chen |
| 2015/0365090 A1 | 12/2015 | Greene et al. |
| 2017/0148727 A1 | 5/2017 | Do et al. |
| 2018/0182856 A1* | 6/2018 | Lee .................. H01L 21/76849 |

FOREIGN PATENT DOCUMENTS

TW 201040963 A 11/2010

OTHER PUBLICATIONS

TW Office Action dated Sep. 22, 2020 in Taiwan application (No. 109109545).

* cited by examiner

*Primary Examiner* — Thanhha S Pham
(74) *Attorney, Agent, or Firm* — McClure, Qualey & Rodack, LLP

(57) ABSTRACT

A semiconductor structure and a manufacturing method for the same. The semiconductor structure includes a plug element and a via element. The plug element includes a tungsten plug. The plug element has a plug size in a lateral direction. The via element is electrically connected on the plug element. The via element is non-symmetrical with respect a center line of the plug element extending along a longitudinal direction. The via element has a via size in the lateral direction. The plug size is bigger than the via size.

5 Claims, 10 Drawing Sheets

SEMICONDUCTOR STRUCTURE AND MANUFACTURING METHOD FOR THE SAME

This is a Divisional Application of U.S. application Ser. No. 16/826,330, filed Mar. 23, 2020, the subject matter of which is incorporated herein by reference.

BACKGROUND

Technical Field

The disclosure relates to a semiconductor structure and a manufacturing method for the same.

Description of the Related Art

With development of the semiconductor technology, semiconductor devices have become smaller in size. In the semiconductor technology, shrinking of feature sizes, and improving operation speed, efficiency, density, and cost per Integrated circuit are important objectives. For satisfy customer need and the market demand, it is important to shrink devices in size and also to maintain the electricity of devices. However, as devices shrink in size, the risk of undesirable damage to layers and elements in devices during the manufacturing process is increased, which results in considerable negative effects upon electrical performance of devices. As such, how to prevent damage to layers and elements in devices has become an issue. Generally, in order to produce semiconductor devices with good electrical performance, profiles of elements in devices should be in complete shape.

SUMMARY

The present disclosure relates to a semiconductor structure and a manufacturing method for the same.

According to an embodiment, a semiconductor structure is provided. The semiconductor structure comprises a plug element and a via element. The plug element comprises a tungsten plug. The plug element has a plug size in a lateral direction. The via element is electrically connected on the plug element. The via element is non-symmetrical with respect a center line of the plug element extending along a longitudinal direction. The via element has a via size in the lateral direction. The plug size is bigger than the via size.

According to another embodiment, a semiconductor structure is provided. The semiconductor structure comprises a plug element and a via element. The plug element comprises a first sidewall plug surface and second sidewall plug surface opposing to the first sidewall plug surface. The via element is electrically connected on the plug element. The via element comprises a first sidewall via surface and a second sidewall via surface opposing to the first sidewall via surface. The first sidewall plug surface and the second sidewall plug surface are respectively outside the first sidewall via surface and the second sidewall via surface. A first gap distance between the first sidewall plug surface and the first sidewall via surface in a lateral direction is different from a second gap distance between the second sidewall plug surface and the second sidewall via surface in the lateral direction.

According to yet another embodiment, a manufacturing method for a semiconductor structure is provided. The manufacturing method comprises the following steps. A hole is formed in a dielectric layer. A tungsten plug is formed inside the hole. A dielectric film is formed on the tungsten plug. An aperture is formed in the dielectric film. The aperture is smaller than the hole. The aperture is misaligned with a center line of the hole. A via element is formed inside the aperture. The via element is electrically connected on the tungsten plug.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Figure 1:
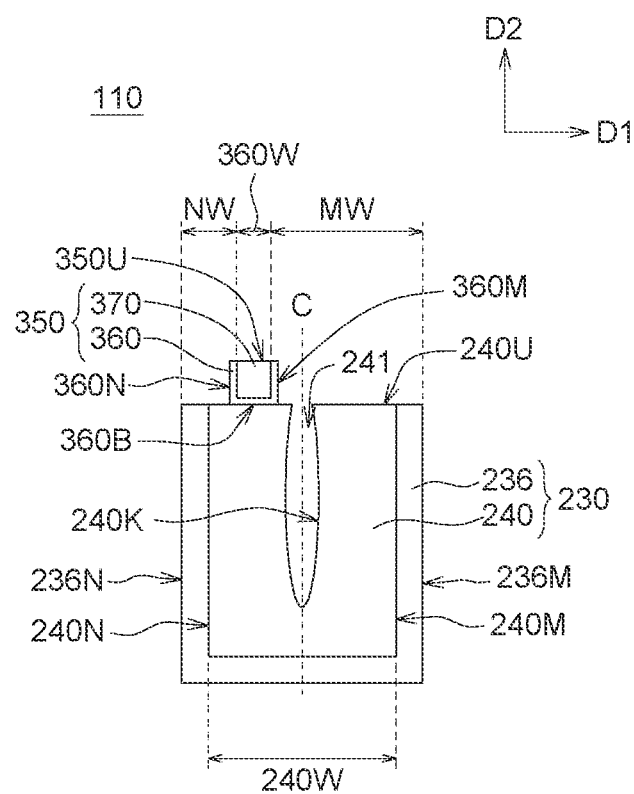
FIG. 1 illustrates a longitudinal cross-section view of a conductive structure 110 of a semiconductor structure according to an embodiment.

FIG. 1 illustrates a longitudinal cross-section view of a conductive structure 110 of a semiconductor structure according to an embodiment. The conductive structure 110 comprises a plug element 230 and a via element 350.

The plug element 230 may comprise a barrier layer 236 and a tungsten plug 240. The tungsten plug 240 is on the barrier layer 236. In an embodiment, the tungsten plug 240 may comprise an inner plug surface 240K. The inner plug surface 240K defines a seam 241 (or void).

The via element 350 is electrically connected on the plug element 230. The via element 350 may comprise a barrier film 360 and a conductive via 370. The conductive via 370 is on the barrier film 360. The barrier film 360 of the via element 350 has a lower via surface 360B. The lower via surface 360B may be in contact with an upper plug surface of the plug element 230. For example, the lower via surface 360B of the barrier film 360 may be electrically in contact with an upper plug surface 240U of the tungsten plug 240.

The barrier layer 236 comprises a first sidewall plug surface 236M and a second sidewall plug surface 236N opposing to the first sidewall plug surface 236M. The first sidewall plug surface 236M and the second sidewall plug surface 236N are outer sidewall plug surfaces of the plug element 230. The tungsten plug 240 comprises a first sidewall plug surface 240M and a second sidewall plug surface 240N opposing to the first sidewall plug surface 240M. The first sidewall plug surface 240M and the second sidewall plug surface 240N are outer sidewall plug surfaces of the tungsten plug 240.

The barrier film 360 comprises a first sidewall via surface 360M and a second sidewall via surface 360N opposing to the first sidewall via surface 360M. The first sidewall via surface 360M and the second sidewall via surface 360N are outer sidewall via surfaces of the via element 350. The first sidewall plug surfaces 236M and 240M and the first sidewall via surface 360M are on the same one side of the conductive structure 110. The second sidewall plug surfaces 236N and 240N and the second sidewall via surface 360N are on the same another side of the conductive structure 110. The first sidewall plug surface 236M (240M) and the second sidewall plug surface 236N (240N) are respectively outside the first sidewall via surface 360M and the second sidewall via surface 360N.

The plug element 230 has a plug size in a lateral direction D1. The via element 350 has a via size in the lateral direction D1. The plug size is bigger than the via size. For example, a plug size 240W defined between the first sidewall plug surface 240M and the second sidewall plug surface 240N of the tungsten plug 240 may be 100 nm to 400 nm, for example 300 nm. A via size 360W of the via element 350 defined between the first sidewall via surface 360M and the second sidewall via surface 360N of the barrier film 360 may be 50 nm to 200 nm, for example 100 nm.

In embodiments, the via element 350 is non-symmetrical with respect to a center line C of the plug element 230 extending along a longitudinal direction D2. As such, a problem of collapse or rough of the upper via surface 350U of the via element 350 due to arranging the via element 350 to be corresponding with the seam 241 in the plug element 230 can be avoided. The via element 350 can have a desired complete structural feature with having the upper via surface 350U being even. Therefore, an electrical connection relation between the conductive structure 110 and a device formed thereon can be improved. Yield and operation efficiency of products can be increased. For example, the via element 350 is misaligned with the center line C. The via element 350 is offset from the center line C. The center line C does not pass through the via element 350. In an embodiment, the center line C may pass through the seam 241. The via element 350 is misaligned with the seam 241. A first gap distance MW between the first sidewall plug surface 236M and the first sidewall via surface 360M in the lateral direction D1 is different from a second gap distance NW between the second sidewall plug surface 236N and the second sidewall via surface 360N in the lateral direction D1. In the present disclosure, the lateral direction D1 (such as an X-direction) may be substantially perpendicular to the longitudinal direction D2 (such as a Y-direction).

Figure 2:
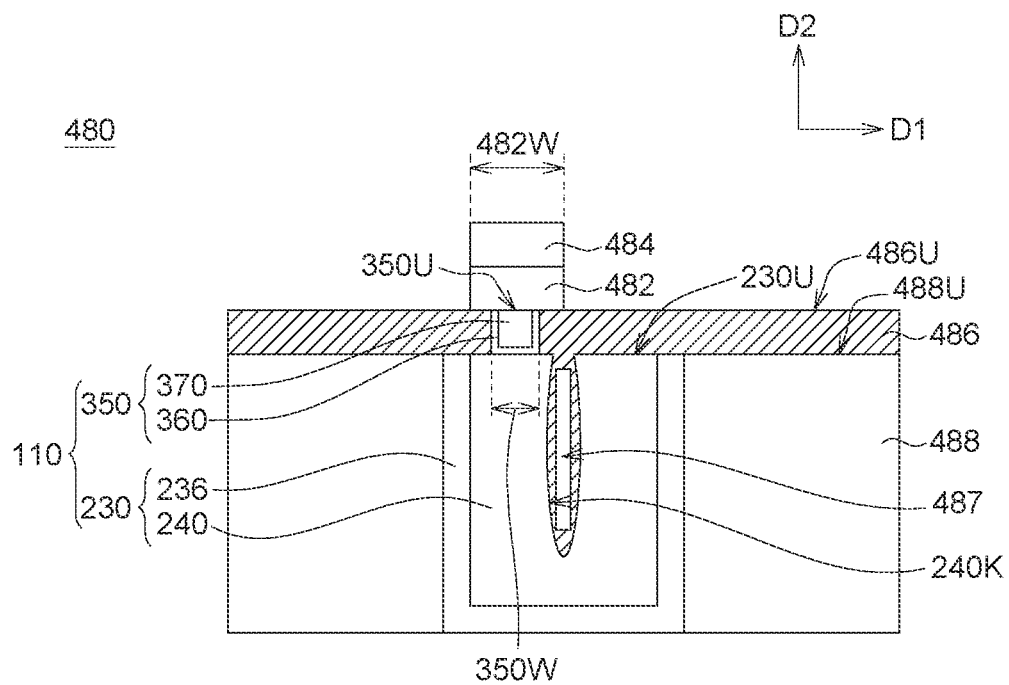
FIG. 2 illustrates a longitudinal cross-section view of a memory device 480 of a semiconductor structure according to an embodiment.

FIG. 2 illustrates a longitudinal cross-section view of a memory device 480 of a semiconductor structure according to an embodiment. The memory device 480 may comprise the conductive structure 110 functioned as a bottom electrode, a memory material layer 482 and a top electrode 484. The memory material layer 482 is electrically connected between the conductive structure 110 (bottom electrode) and the top electrode 484. The via element 350 is electrically connected between the plug element 230 and the memory material layer 482. In this embodiment, the memory material layer 482 may be on the upper via surface 350U of the via element 350 and an upper dielectric surface 486U of a dielectric film 486. A size 482W of the memory material layer 482 in the lateral direction D1 is bigger than a size 350W of the via element 350 in the lateral direction D1. The top electrode 484 may be on the memory material layer 482.

The memory device 480 may be a phase change memory (PCM) device. In an embodiment, the memory material layer 482 comprises a phase change memory material, comprising GeSbTe (GST), etc., for example.

The barrier layer 236 may be in a dielectric layer 488. The dielectric film 486 may be extended from the inner plug surface 240K of the tungsten plug 240 onto an upper plug surface 230U of the plug element 230 and an upper dielectric surface 488U of the dielectric layer 488. The dielectric film 486 may define a seam 487. The seam 487 is inside the tungsten plug 240.

Figure 3:
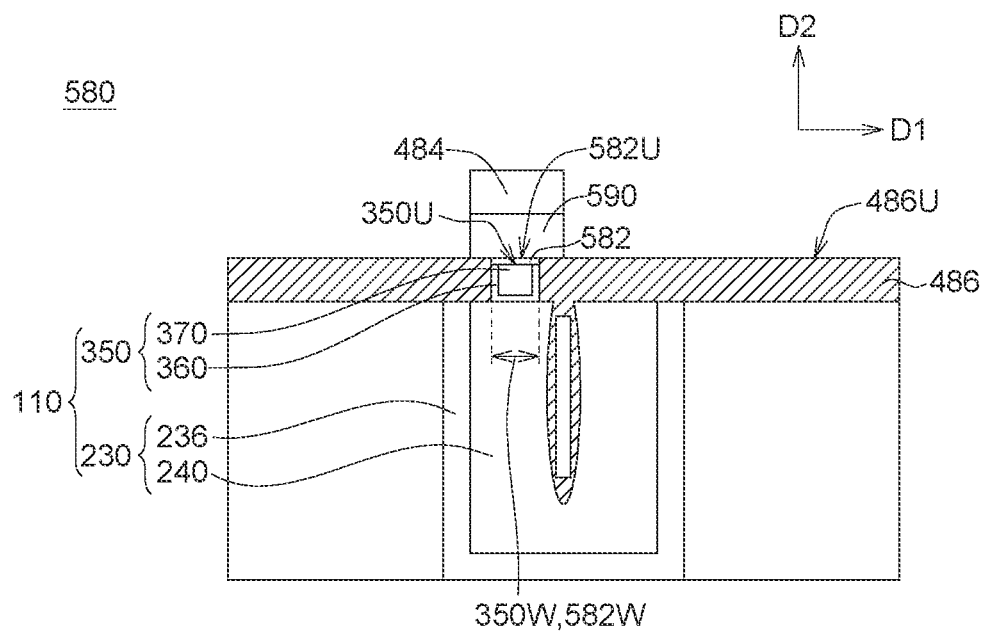
FIG. 3 illustrates a longitudinal cross-section view of a memory device 580 of a semiconductor structure according to another embodiment.

FIG. 3 illustrates a longitudinal cross-section view of a memory device 580 of a semiconductor structure according to another embodiment. The memory device 580 in FIG. 3 is different from the memory device 480 in FIG. 2 with the following description. The memory device 580 may comprise a memory material layer 582 and an interface layer 590. The memory material layer 582 is on the upper via surface 350U of the via element 350. The interface layer 590 is on an upper memory surface 582U of the memory material layer 582 and the upper dielectric surface 486U of the dielectric film 486. The top electrode 484 is on the interface layer 590. The memory material layer 582 is electrically connected between the conductive structure 110 (the bottom electrode) and the top electrode 484. The via element 350 is electrically connected between the plug element 230 and the memory material layer 582.

A size 582W of the memory material layer 582 in the lateral direction D1 may be equal to the size 350W of the via element 350 in the lateral direction D1. For example, an area of the memory material layer 582 may be equal to an area of the via element 350. Otherwise, the area of the memory material layer 582 may be equal to an area of the conductive via 370. In an embodiment, the memory device 580 may be a resistive random-access memory (ReRAM) device. The memory material layer 582 comprises a programmable resistive memory material, such as a metal oxide, such as TiON, $WO_x$, $HfO_x$, TaON, $TiO_x$, $TaO_x$, $SiO_x$, etc.

FIG. 4A to FIG. 4E illustrate a manufacturing method for a semiconductor structure according to an embodiment.

Figure 4A:
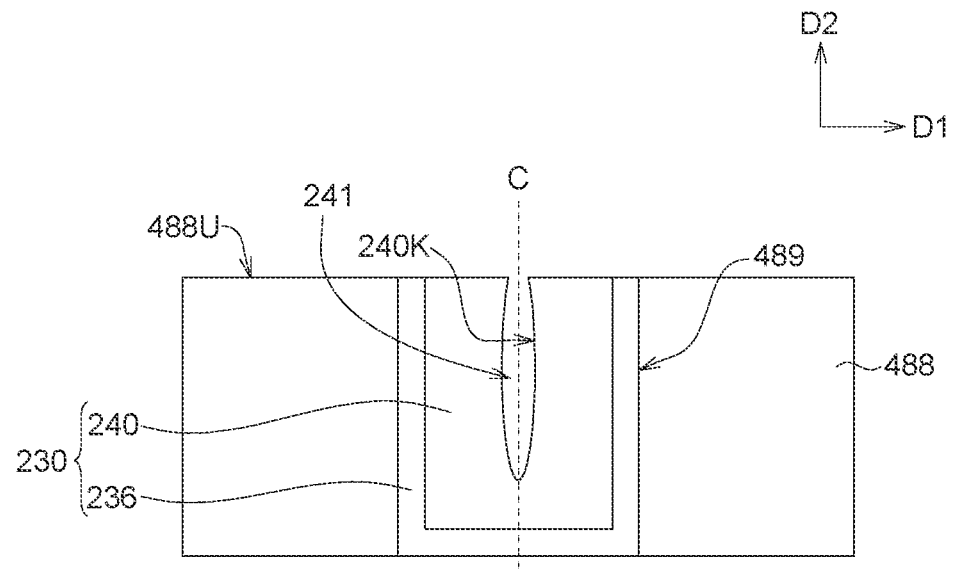
FIG. 4A to FIG. 4E illustrate a manufacturing method for a semiconductor structure according to an embodiment.

Referring to FIG. 4A, the dielectric layer 488 is provided. The dielectric layer 488 may comprise $SiO_2$, SiN, SiON, $Al_2O_3$, etc. A hole 489 is formed in the dielectric layer 488. The hole 489 may have the center line C. For example, two distances from the center line C to opposing inner sidewall surfaces of the hole 489 respectively are identical substantially. The barrier layer 236 may be formed in the hole 489. The barrier layer 236 may comprise a metal barrier material, for example, comprising TiN, Ta, Co, Ti, TaN, Si, Mn, etc. The tungsten plug 240 may be formed on the barrier layer 236 in the hole 489. In an embodiment, the barrier layer 236 and a conductive material layer may be formed in the hole 489 and on the upper dielectric surface 488U of the dielectric layer 488 by a deposition method. Next, portions of the barrier layer 236 and the conductive material layer on the upper dielectric surface 488U of the dielectric layer 488 are removed, and portions of the barrier layer 236 and the conductive material layer in the hole 489 are remained. By which, the plug element 230 is formed. The portion of the conductive material layer in the hole 489 is a conductive plug. This removing step may be performed with a chemical mechanical polishing method or other suitable etching methods. In an embodiment, a material for the conductive material layer is tungsten, and the conductive plug is the tungsten plug 240. In an embodiment, the tungsten plug 240 does not fully fill the hole 489, and the tungsten plug 240 has the inner plug surface 240K defining the seam 241. The center line C may pass through the seam 241. In another embodiment, the tungsten plug 240 may fully fill the hole 489, and the tungsten plug 240 has no seam therein (not shown).

Figure 4B:
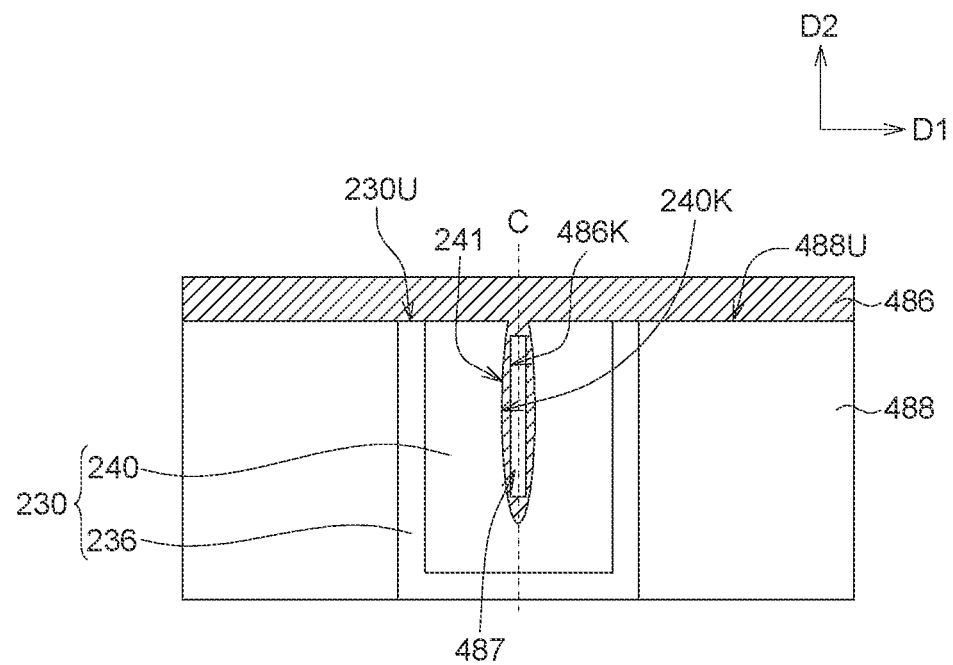

Referring to FIG. 4B, the dielectric film 486 may be formed on the inner plug surface 240K of the tungsten plug 240 exposed by the seam 241, and extended onto the upper plug surface 230U of the plug element 230 and the upper dielectric surface 488U of the dielectric layer 488. In an embodiment, the dielectric film 486 does not fully fill the seam 241, and the dielectric film 486 has an inner sidewall dielectric surface 486K defining the seam 487. The center line C may pass through the seam 487. In another embodiment, the dielectric film 486 may fully fill the seam 241, and the dielectric film 486 has no seam therein (not shown). The dielectric film 486 may have a thickness of 200 angstroms to 2000 angstroms, such as 1000 angstroms. The dielectric film 486 may comprise $SiO_2$, SiN, SiON, $Al_2O_3$, etc.

Figure 4C:
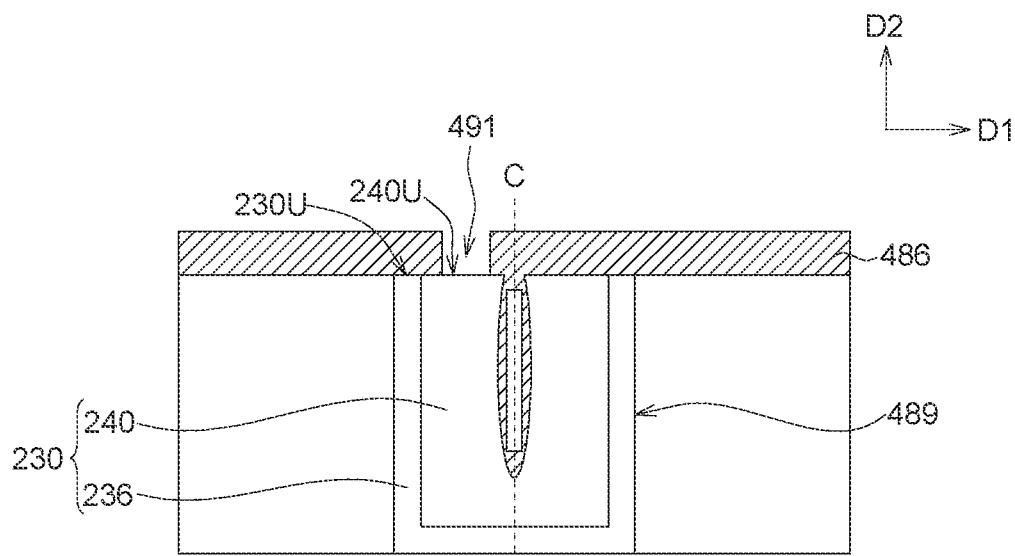

Referring to FIG. 4C, an aperture 491 may be formed in the dielectric film 486 by a photolithography etching process, for example. The aperture 491 is smaller than the hole 489, and is misaligned with the center line C. The center line C does not pass through the aperture 491. A bottom of the aperture 491 may expose only the upper plug surface 230U of the plug element 230. For example, the bottom of the aperture 491 may expose only the upper plug surface 240U of the tungsten plug 240.

Figure 4D:
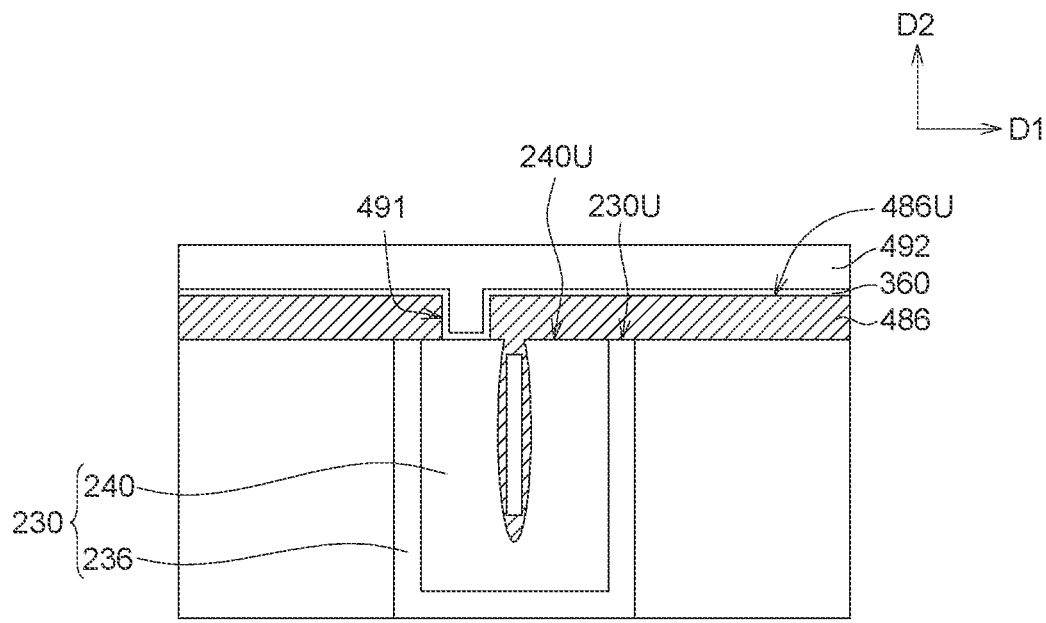

Referring to FIG. 4D, the barrier film 360 may be formed on the upper plug surface 230U (upper plug surface 240U) of the plug element 230 (tungsten plug 240) and a sidewall dielectric surface of the dielectric film 486 exposed by the aperture 491, and on the upper dielectric surface 486U of the dielectric film 486. The barrier film 360 may comprise a metal barrier material, for example, comprising TiN, Ta, Co, Ti, TaN, Si, Mn, etc. A conductive material layer 492 may be formed on the barrier film 360. The conductive material layer 492 may comprise a metal, for example, comprising TiN, Ti, Ta, TaN, W, Si, Cu, etc.

Figure 4E:
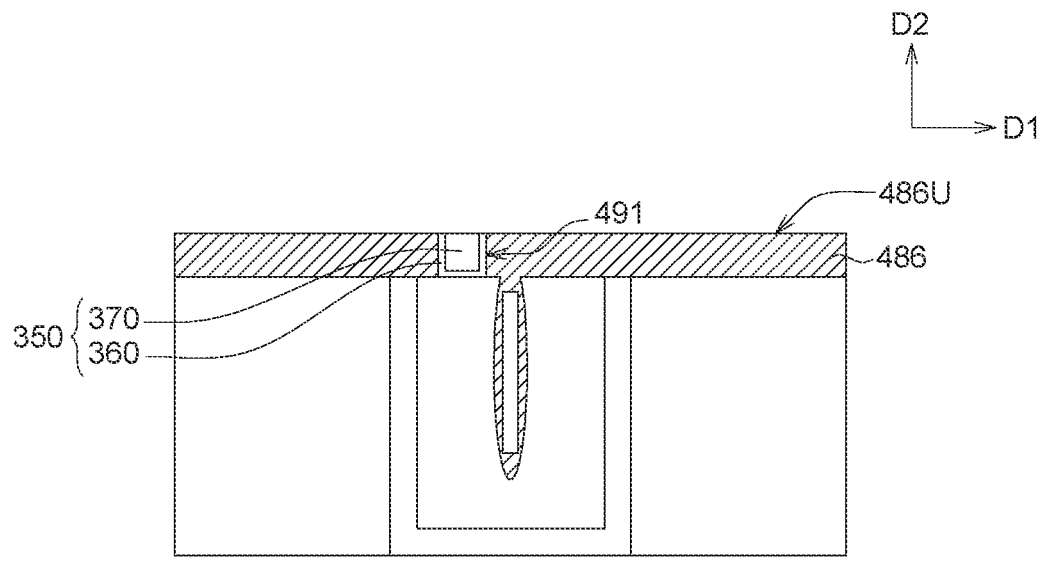

Referring to FIG. 4E, portions of the barrier film 360 and the conductive material layer 492 on the upper dielectric surface 486U of the dielectric film 486 are removed, and portions of the barrier film 360 and the conductive material layer 492 in the aperture 491 are remained, so as to form the via element 350. The portion of the conductive material layer 492 in the aperture 491 is the conductive via 370. This removing step may be performed by a chemical mechanical polishing method or other suitable etching methods.

Next, referring to FIG. 2, the memory material layer 482 covering on the via element 350 and the dielectric film 486 may be formed, and the top electrode 484 covering on the memory material layer 482 may be formed, and then a patterning step may be performed to the memory material layer 482 and the top electrode 484 with using a photolithography etching process. By which, the memory device 480 as shown in FIG. 2 may be formed. The top electrode 484 may comprise any suitable conductive material such as W, TiN, TaN, Ti, Ta, Hf, Pt, Ru, Ir, Cu, etc.

Figure 5:
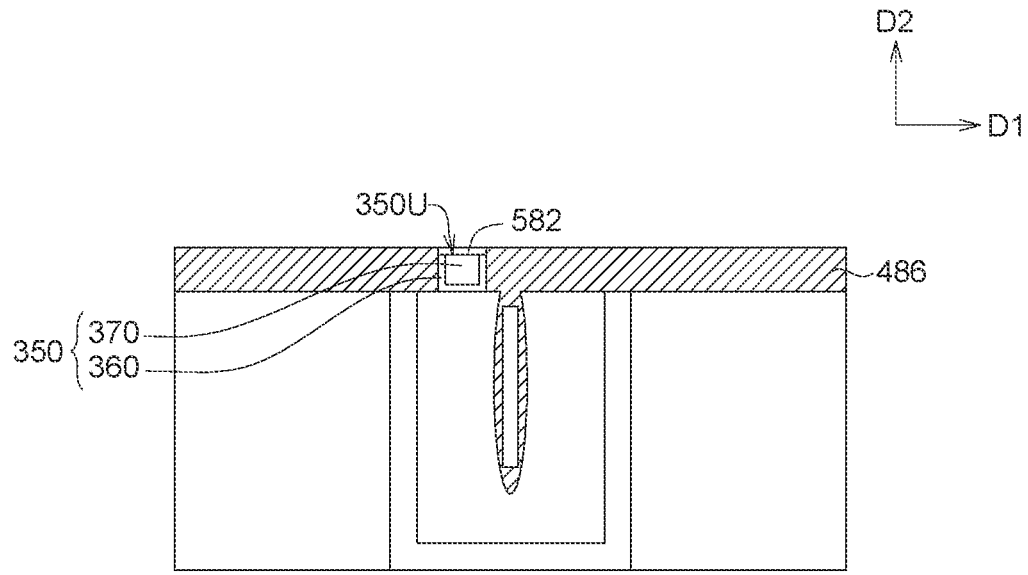
FIG. 5 illustrates a manufacturing method for a semiconductor structure according to an embodiment.

In another embodiment, after the step illustrated with referring to FIG. 4E, a step stage as shown in FIG. 5 may be performed. Referring to FIG. 5, the memory material layer 582 may be formed on the upper via surface 350U of the via element 350. In an embodiment, the memory material layer 582 is a metal oxide layer formed by an oxidation treatment performed to the upper via surface 350U of the via element 350. For example, the metal oxide layer comprises TiON, $WO_x$, $HfO_x$, TaON, $TiO_x$, $TaO_x$, $SiO_x$, etc. The oxidation treatment may comprise an oxidation treatment process or plasma process with applying oxygen gas ($O_2$) or ozone ($O_3$), or other suitable methods. The present disclosure is not limited thereto.

Next, referring to FIG. 3, the interface layer 590 covering on the via element 350 and the dielectric film 486 may be formed, and the top electrode 484 covering on the interface layer 590 may be formed, and then a patterning step may be performed to the interface layer 590 and the top electrode 484 with using a photolithography etching process. By which, the memory device 580 as shown in FIG. 3 may be formed. The interface layer 590 may comprise Ti, Ta, TiN, TaN, Si, etc.

FIG. 6A to FIG. 6F illustrate a manufacturing method for a semiconductor structure according to an embodiment.

Figure 6A:
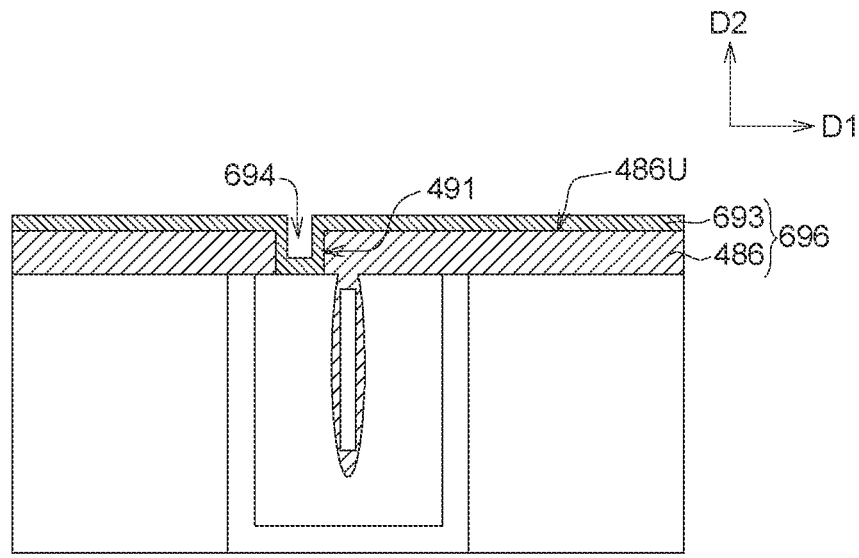
FIG. 6A to FIG. 6F illustrate a manufacturing method for a semiconductor structure according to an embodiment.

In an embodiment, after the step illustrated with referring to FIG. 4C, a step stage as shown in FIG. 6A may be performed. Referring to FIG. 6A, a dielectric film 693 is formed in the aperture 491 of the dielectric film 486, and extending onto the upper dielectric surface 486U of the dielectric film 486. The dielectric film 693 defining a recess 694 corresponding to the aperture 491. A dielectric film 696 comprises the dielectric film 486 and the dielectric film 693. The dielectric film 693 may have a thickness of 500 angstroms to 2500 angstroms, such as 1500 angstroms.

Figure 6B:
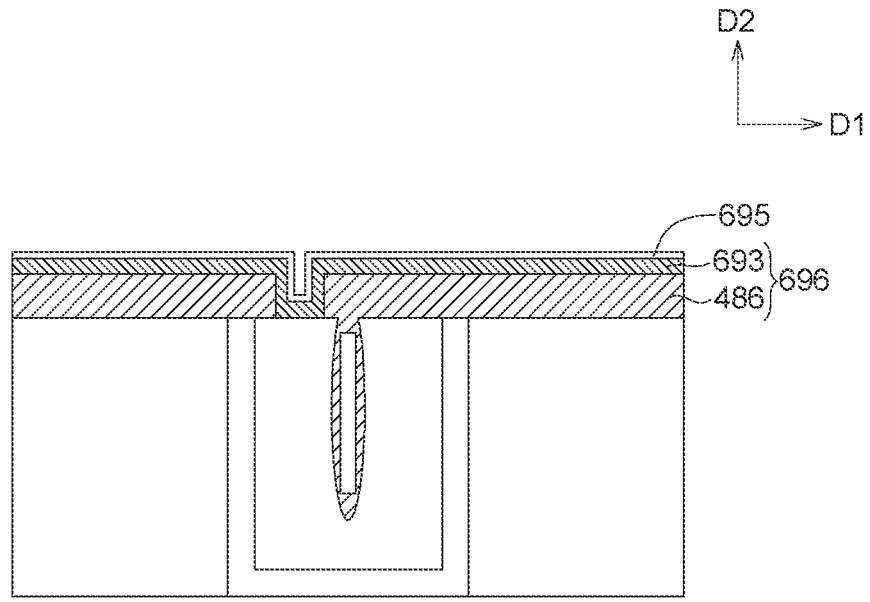

Referring to FIG. 6B, a mask layer 695 may be formed on the dielectric film 693. In an embodiment, the mask layer 695 may comprise a metal barrier material, such as TiN, TaN, Ti, Ta, Si, etc. However, the present disclosure is not limited thereto. Other materials suitable for the mask layer 695 may be used. The mask layer 695 may have a thickness of 10 angstroms to 100 angstroms, such as 25 angstroms.

Figure 6C:
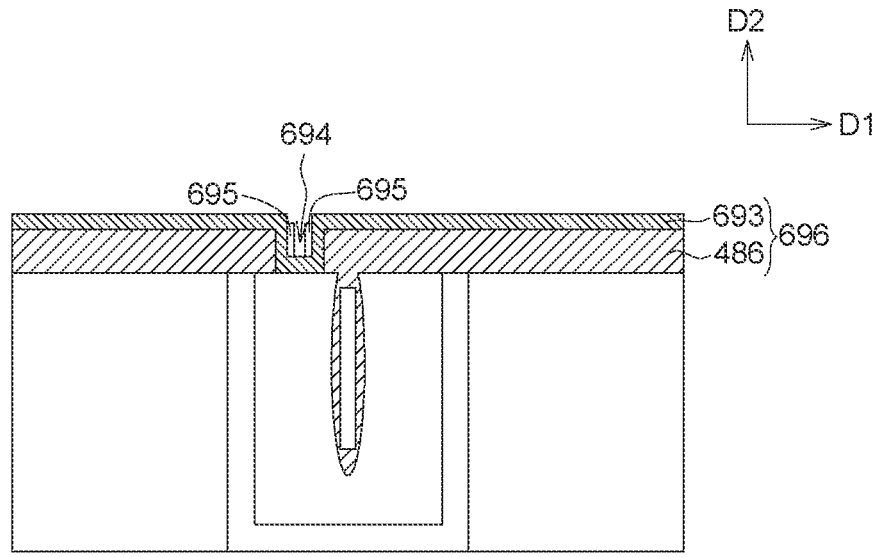

Referring to FIG. 6C, for example, an anisotropic etching method, or other suitable etching methods, may be used to remove a portion of the mask layer 695 on an upper dielectric surface of the dielectric film 693, while remaining a portion of the mask layer 695 on a sidewall dielectric surface of the dielectric film 693.

Figure 6D:
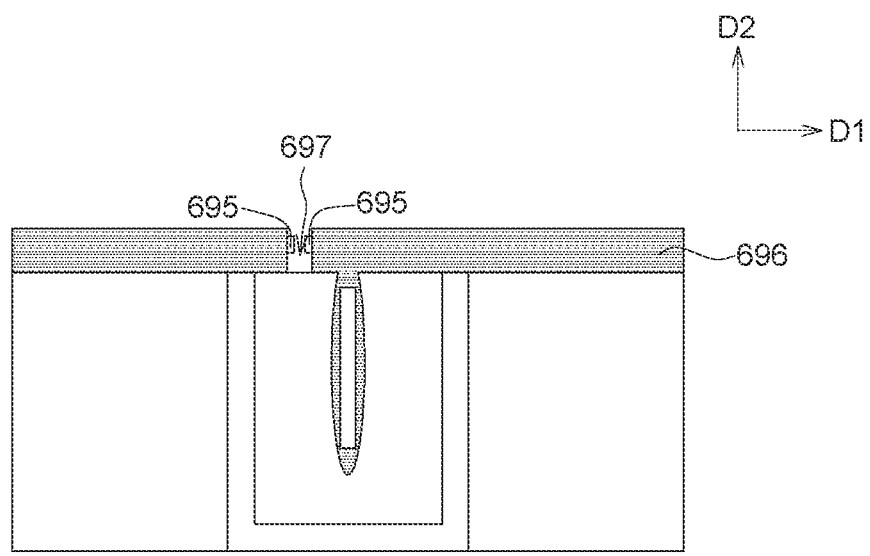

Referring to FIG. 6D, an etching step with using the mask layer 695 as an etching mask may be performed to remove the dielectric film 693 of the dielectric film 696 exposed by and under the recess 694 so as to form an aperture 697. In an embodiment, after the aperture 697 is formed, the mask layer 695 is removed. In another embodiment, the mask layer 695 may be not removed.

Figure 6E:
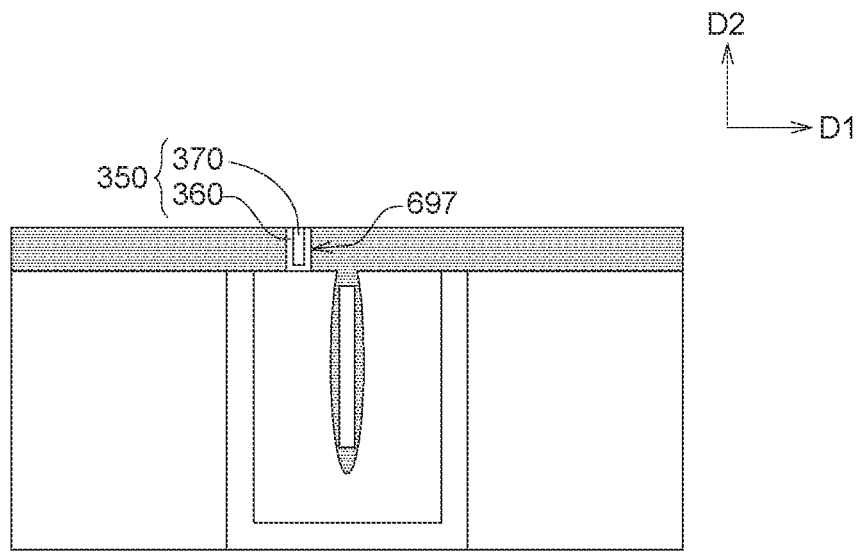

Referring to FIG. 6E, the via element 350 comprising the barrier film 360 and the conductive via 370 may be formed in the aperture 697.

Figure 6F:
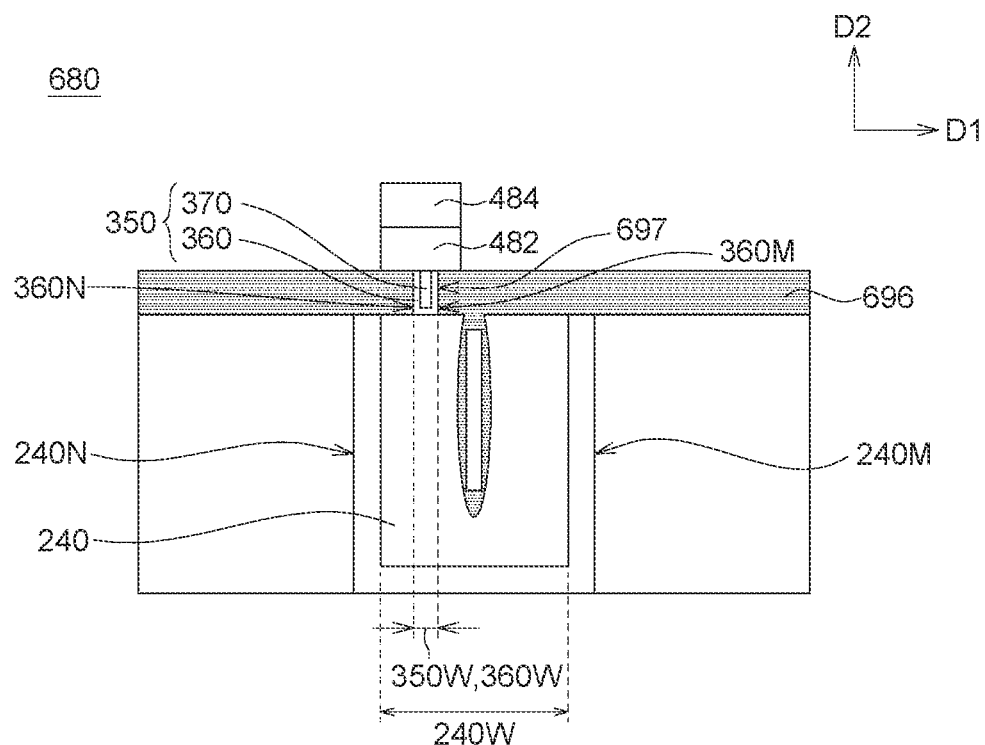

Referring to FIG. 6F, the memory material layer 482 is formed on the via element 350 and the dielectric film 696. The top electrode 484 is formed on the memory material layer 482.

In this embodiment, the aperture 697 formed by the process method through FIG. 6A to FIG. 6D may be smaller than the aperture 491 as shown in FIG. 4C. Therefore, the via element 350 of a memory device 680 as shown in FIG. 6F may have the size 350W smaller than the size 350W of the via element 350 as shown in FIG. 2.

Referring to FIG. 6F, in an embodiment, the plug size 240W defining between the first sidewall plug surface 240M and the second sidewall plug surface 240N of the tungsten plug 240 may be 100 nm to 400 nm, such as 300 nm. The via size 360W defining between the first sidewall via surface 360M and the second sidewall via surface 360N of the barrier film 360 of the via element 350 may be 10 nm to 50 nm, such as 30 nm. However, the present disclosure is not limited thereto. For example, a value of dividing the plug size 240W by the via size 360W may be bigger than 4.

Figure 7:
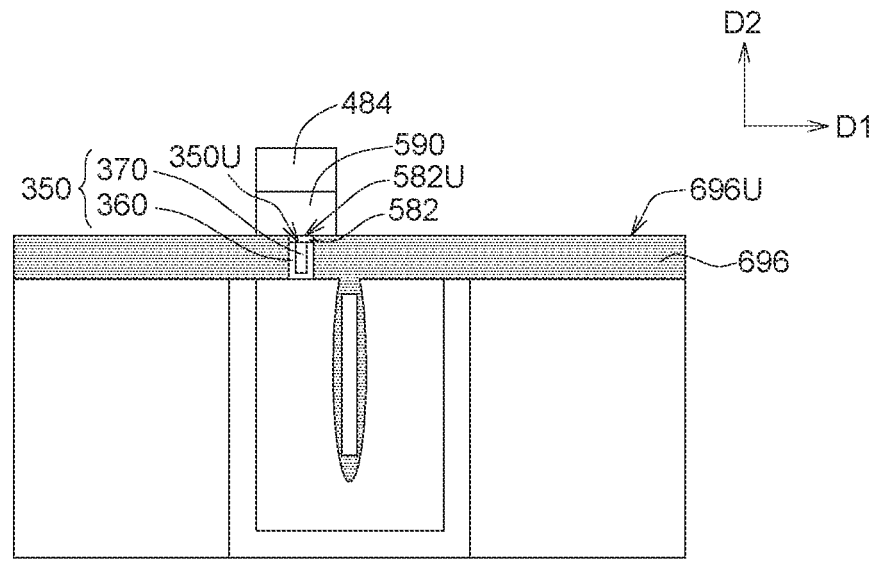
FIG. 7 illustrates a manufacturing method for a semiconductor structure according to an embodiment.

In another embodiment, after the step illustrated with referring to FIG. 6E, a step stage as shown in FIG. 7 may be performed. Referring to FIG. 7, the memory material layer 582 may be formed on the upper via surface 350U of the via element 350. Then, the interface layer 590 is formed on the upper memory surface 582U of the memory material layer 582 and an upper dielectric surface 696U of the dielectric film 696. The top electrode 484 is formed on the interface layer 590.

Figure 8:
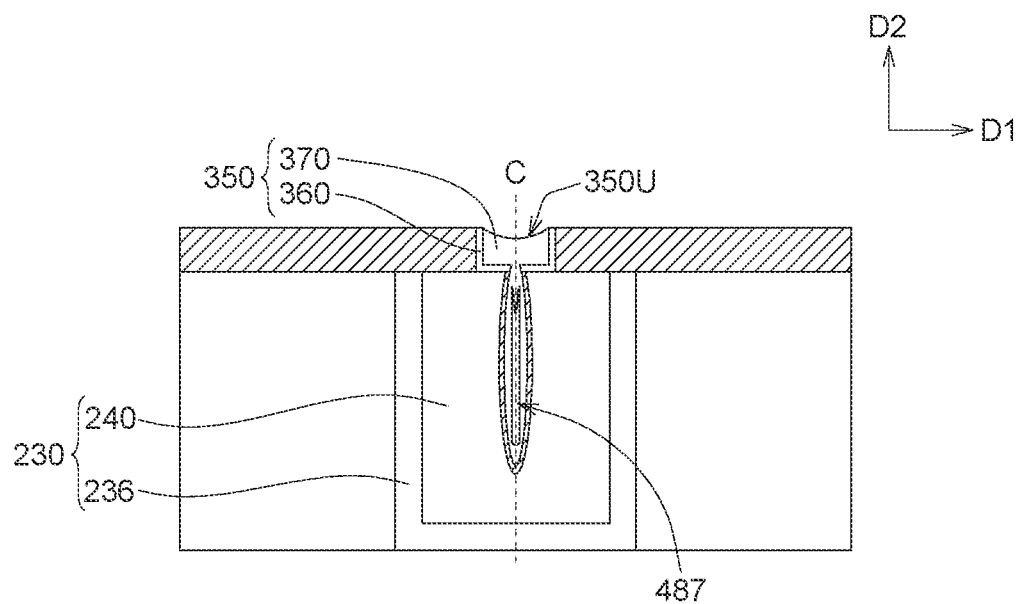
FIG. 8 is a cross-section view of semiconductor structures of a comparative example.
Figure 9:
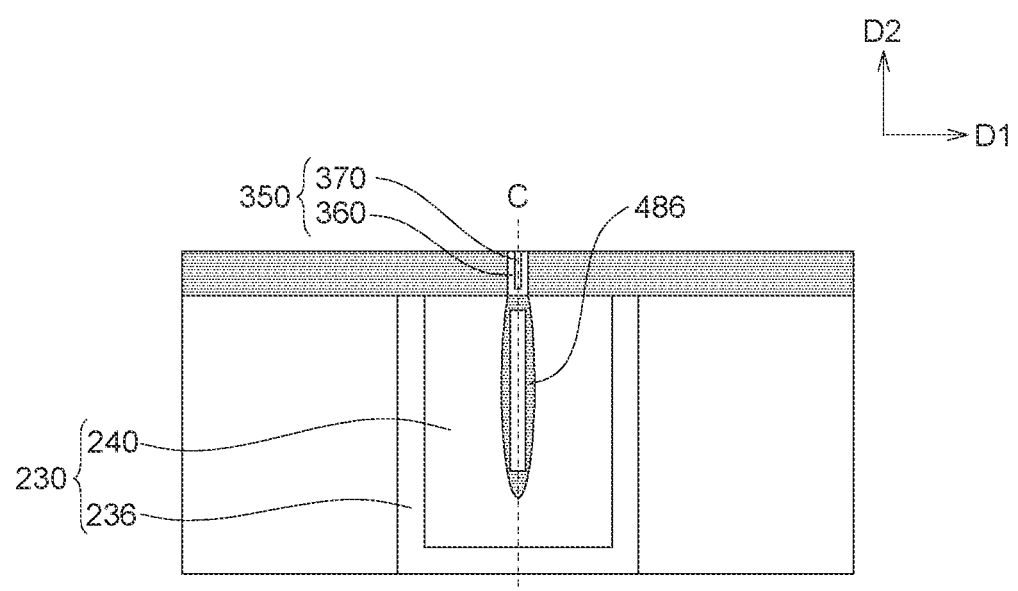
FIG. 9 is a cross-section view of semiconductor structures of a comparative example.

FIG. 8 and FIG. 9 are cross-section views of semiconductor structures of comparative examples, which are different from the embodiments in that, the center line C passes through the via element 350. As shown in FIG. 8, it could be found that this difference may cause problem of collapse or rough of the upper via surface 350U of the via element 350 due to falling of the conductive via 370 into the seam 487. The falling of the conductive via 370 into the seam 487 may be resulted from a pressing force applied during the chemical mechanical polishing step performed to the conductive material layer 492 illustrated with referring to FIG. 4D and FIG. 4E, for example. In FIG. 9, the via element 350 having a smaller size may be electrically insulated from the tungsten plug 240 by the dielectric film 486. The via element 350 and the plug element 230 are electrically insulated from each other. It would lead to an electrical defect problem to a device to be formed on this conductive structure.

In embodiments, the via element 350 of the conductive structure 110 is non-symmetrical with respect the center line C of the plug element 230. As such, the problem of collapse or rough of the upper via surface 350U of the via element 350 due to arranging the conductive via 370 to be corresponding with the seam in the plug element 230 can be avoided. The via element 350 can have a desired complete structural feature with having the upper via surface 350U being even. Therefore, an electrical connection relation between the conductive structure 110 and a device formed thereon can be improved. Yield and operation efficiency of products can be increased.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method for a semiconductor structure, comprising:
    forming a hole in a dielectric layer;
    forming a tungsten plug inside the hole;
    forming a dielectric film on the tungsten plug;
    forming an aperture in the dielectric film, wherein the aperture is smaller than the hole and is misaligned with a center line of the hole; and
    forming a via element inside the aperture, wherein the via element is electrically connected on the tungsten plug, the tungsten plug has an inner plug surface defining a seam, the seam and the via element are non-overlapping.

2. The manufacturing method for the semiconductor structure according to claim 1, wherein the dielectric film is on the inner plug surface exposed by the seam and is on an upper plug surface of the tungsten plug, the center line passes through the seam.

3. The manufacturing method for the semiconductor structure according to claim 1, further comprising:
    forming a memory material layer on the via element; and
    forming a top electrode on the memory material layer.

4. The manufacturing method for the semiconductor structure according to claim 1, further comprising:
    forming another dielectric film in the aperture, wherein the another dielectric film defines a recess corresponding to the aperture;
    forming a mask layer on a sidewall dielectric surface of the another dielectric film exposed by the recess; and
    performing an etching step with using the mask layer as an etching mask to remove the another dielectric film exposed by the recess so as to form another aperture smaller than the aperture, wherein the via element is formed in the another aperture.

5. The manufacturing method for the semiconductor structure according to claim 1, further comprising form a barrier layer in the hole, wherein the tungsten plug is formed on the barrier layer, wherein the forming the via element inside the aperture comprises:
    forming a barrier film in the aperture; and
    forming a conductive via on the barrier film.

* * * * *